(12) United States Patent
Gan et al.

(10) Patent No.: US 7,776,675 B1
(45) Date of Patent: Aug. 17, 2010

(54) METHOD FOR FORMING A REDUCED RESISTIVITY POLY GATE AND RELATED STRUCTURE

(75) Inventors: Dong Gan, Brea, CA (US); Joe W. Adamic, Yorba Linda, CA (US)

(73) Assignee: Newport Fab, LLC, Newport Beach, CA (US)

(*) Notice: Subject to any disclaimer, the term of this patent is extended or adjusted under 35 U.S.C. 154(b) by 162 days.

(21) Appl. No.: 11/980,129

(22) Filed: Oct. 29, 2007

(51) Int. Cl.
*H01L 21/265* (2006.01)

(52) U.S. Cl. .................. 438/199; 257/E21.334
(58) Field of Classification Search .......... 257/E21.328, 257/E21.334; 438/199, 229, 664
See application file for complete search history.

(56) References Cited

U.S. PATENT DOCUMENTS 5,654,241 A * 8/1997 Kakumu .................. 438/306

OTHER PUBLICATIONS

Mann, R. W., et al. "Reduction of the C54-TiSi.sub.2 phase transformation temperature using refractory metal ion implantation." Appl. Phys. Let. 67 (25), p. 3729-31, Dec. 18, 1995.*

"Formation of void in Ti-salicided $BF^{2+}$-doped submicron polysilicon lines" by H. N. Chua et al. (Journal of Applied Physics, vol. 87, No. 12, Jun. 15, 2000).
"Titanium silicide formation on $BF^2+$-implanted silicon" by T.P. Chow et al. (Appl. Phys. Lett. 46(1), Jan. 1985).
"Formation of bubbles in $BF^2+$-implanted silicon" by C.W. Nieh and L. J. Chen (Appl. Phys. Lett. 48(22), Jun. 1986).
"Reduction of the C54-TiSi2 phase transformation temperature using refractory metal ion implantation" by R. W. Mann et al. (Appl. Phys. Lett. 67(25), Dec. 18, 1995).
"TiSi2 phase transformation characteristics on narrow devices" by Glen L. Miles et al. (Thin Solid Films 290-291 (1996), 469-472).
"Salicides for 0.10um gate lengths: A comparative study of one-step RTP Ti with Mo doping, Ti with pre-amorphization and Co processes" by Jorge A. Kittl et al. (1997 Symposium on VLSI Technology Digest of Technical Papers).

* cited by examiner

*Primary Examiner*—W. David Coleman
*Assistant Examiner*—Daniel Shook
(74) *Attorney, Agent, or Firm*—Farjami & Farjami LLP

(57) ABSTRACT

According to an exemplary embodiment, a method for forming a reduced resistivity poly gate includes a step of implanting a refractory metal, such as molybdenum, in an N type poly layer in a PFET region of a semiconductor substrate. The method further includes a step of implanting a boron-fluoride compound, such as boron difluoride, in an N type gate in the PFET region, where the N type gate comprises a portion of the N type poly layer. The method further includes a step of forming a titanium silicide segment in the N type gate. The refractory metal reduces a resistivity of the titanium silicide segment, thereby forming the reduced resistivity poly gate.

20 Claims, 15 Drawing Sheets

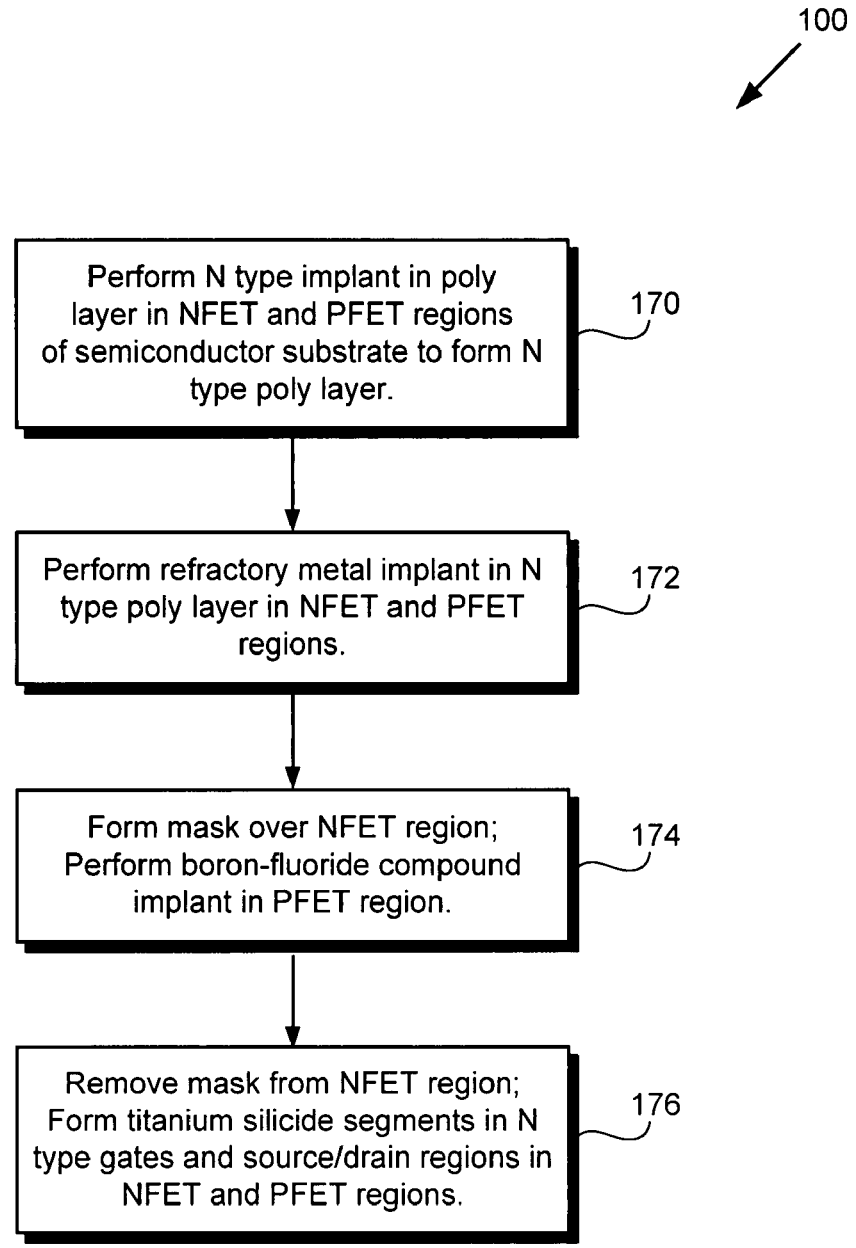

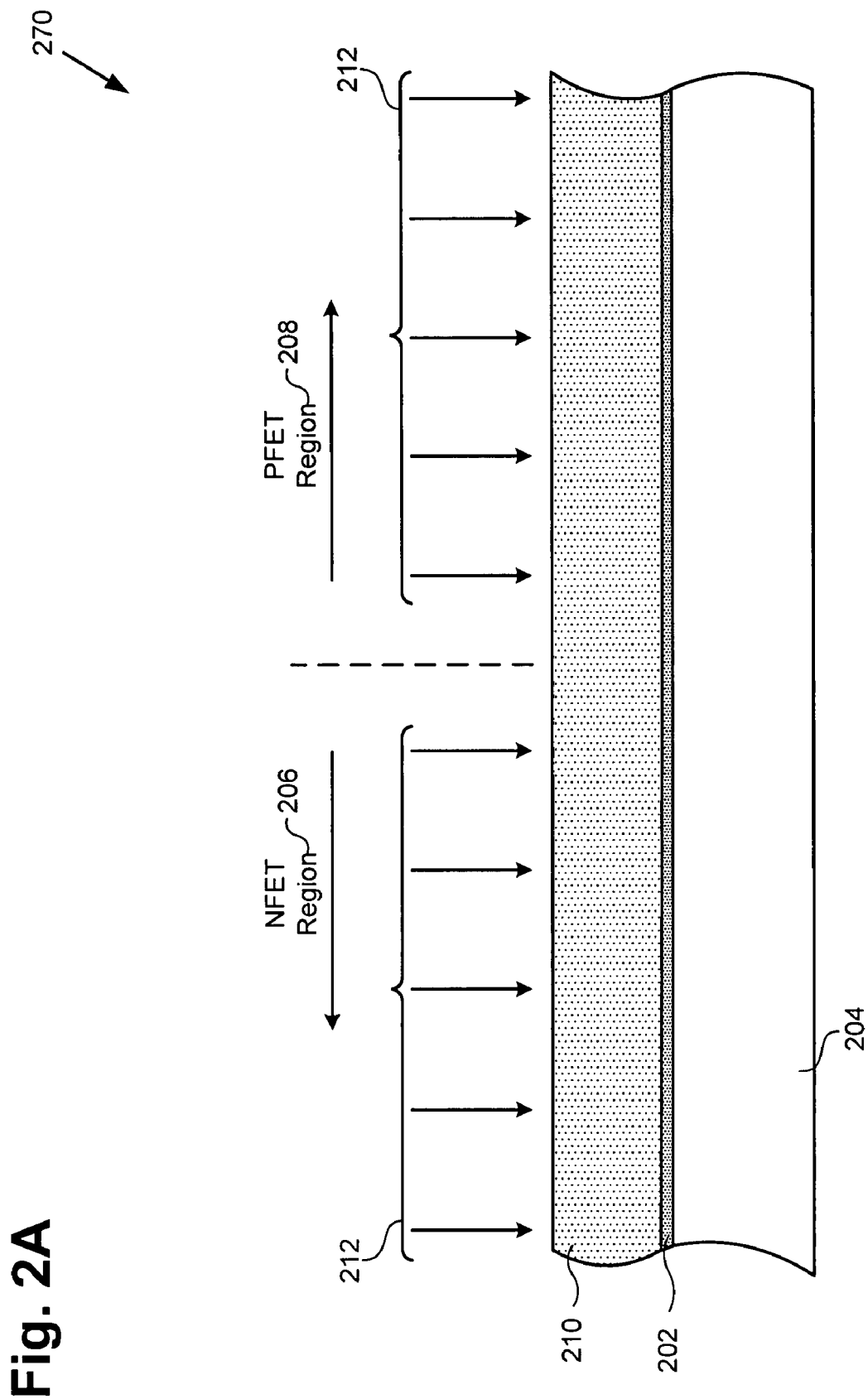

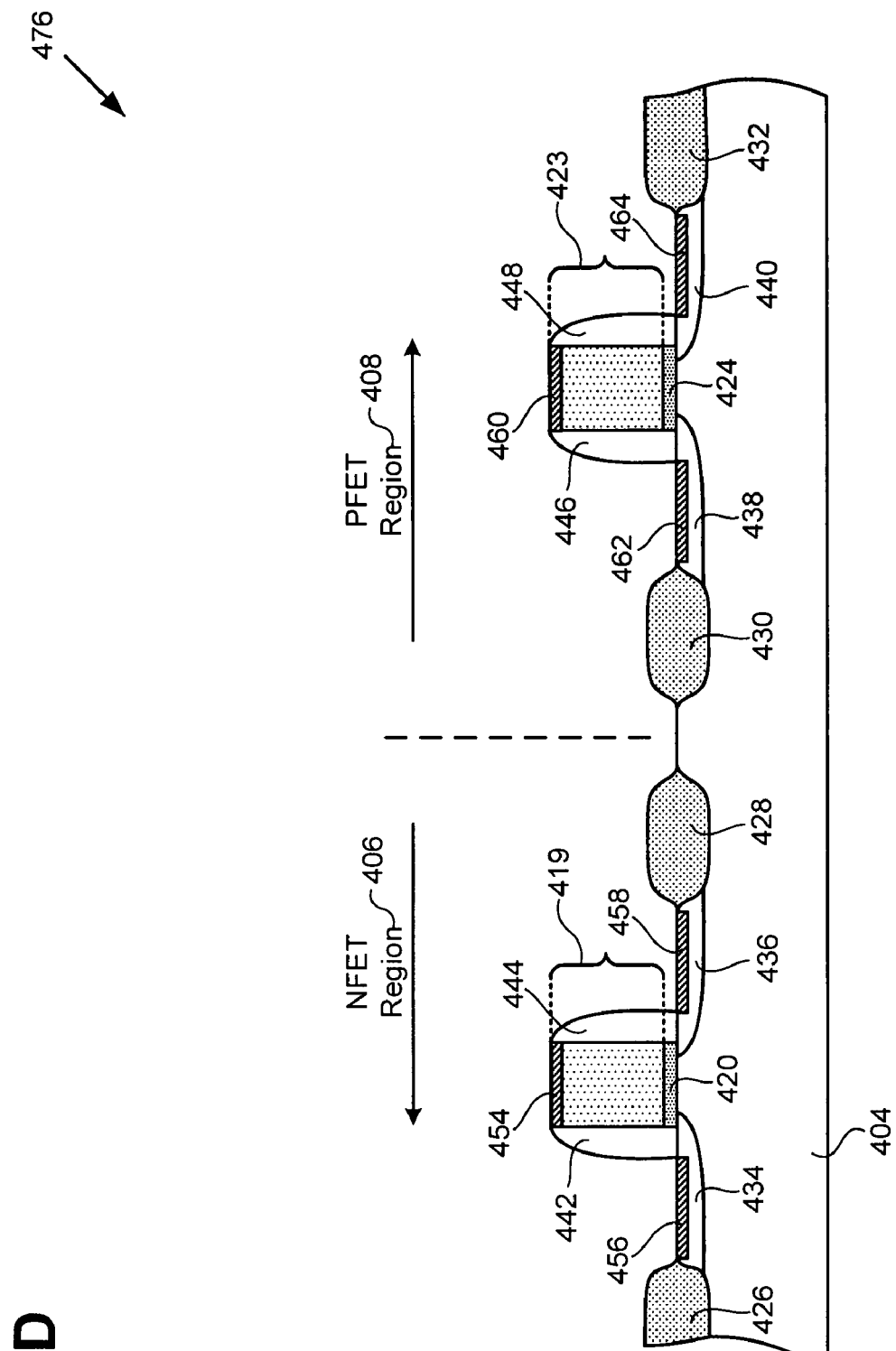

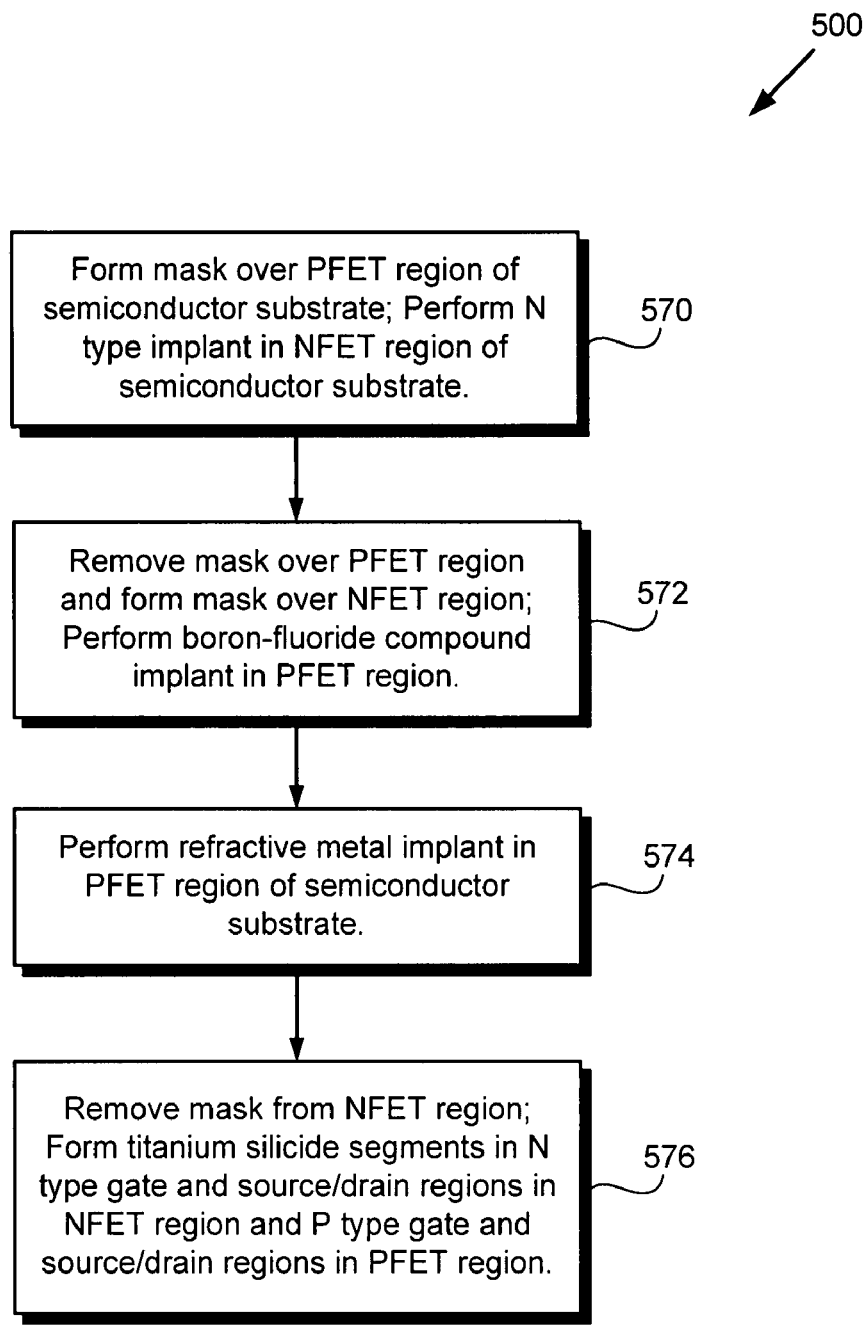

METHOD FOR FORMING A REDUCED RESISTIVITY POLY GATE AND RELATED STRUCTURE

BACKGROUND OF THE INVENTION

1. Field of the Invention

The present invention is generally in the field of semiconductors. More particularly, the invention is in the field of field effect transistor (FET) fabrication.

2. Background Art

In CMOS technologies, such as deep submicron CMOS technologies, boron difluoride ($BF_2$) is typically implanted to form P type polycrystalline silicon (poly) gates and P type source/drain regions for P-channel field effect transistors (PFETs). Incorporation of fluorine in the polysilicon gate and source/drain region implant provides various advantages, such as a shallow P type junction depth, improved device radiation hardness, and lower device interface degradation from hot electron effects. However, when titanium silicide, which is utilized for its low sheet resistance and low contact resistance to silicon, is formed in poly gates that have been implanted with $BF_2$, fluorine that dissociates from the implanted $BF_2$ can form voids and/or bubbles in the titanium silicide, which can cause increased sheet resistance and large sheet resistance variations in the titanium silicide and, consequently, increased poly gate resistivity.

Various conventional approaches have been attempted to overcome the above discussed problems caused by fluorine on titanium silicide sheet resistance and, consequently, on poly gate resistivity. One conventional approach is to use boron in place of $BF_2$ for P type implanting of PFET poly gates. Although titanium silicide formed in boron implanted polysilicon does not have the sheet resistance problems of titanium silicide formed in $BF_2$ implanted polysilicon, boron has a faster diffusion rate than $BF_2$, which can undesirably affect transistor performance. Another conventional approach is to form a layer of silicon oxide on the $BF_2$ implanted poly gate before forming the titanium silicide. In this approach, an anneal can be performed to cause the fluorine in the $BF_2$ to diffuse into the silicon oxide layer, which can be removed prior to titanium silicide formation. However, this approach can undesirably affect transistor design and can also undesirably increase process complexity.

SUMMARY OF THE INVENTION

A method for forming a reduced resistivity poly gate and related structure, substantially as shown in and/or described in connection with at least one of the figures, as set forth more completely in the claims.

BRIEF DESCRIPTION OF THE DRAWINGS

FIG. 1 shows a flowchart illustrating the steps taken to implement an embodiment of the present invention.

FIG. 2A illustrates a cross-sectional view, which includes a portion of a wafer processed according to an embodiment of the invention, corresponding to an initial step in the flowchart in FIG. 1.

FIG. 4D illustrates a cross-sectional view, which includes a portion of a wafer processed according to an embodiment of the invention, corresponding to a final step in the flowchart in FIG. 3.

FIG. 5 shows a flowchart illustrating the steps taken to implement an embodiment of the present invention.

DETAILED DESCRIPTION OF THE INVENTION

Figure 2B:
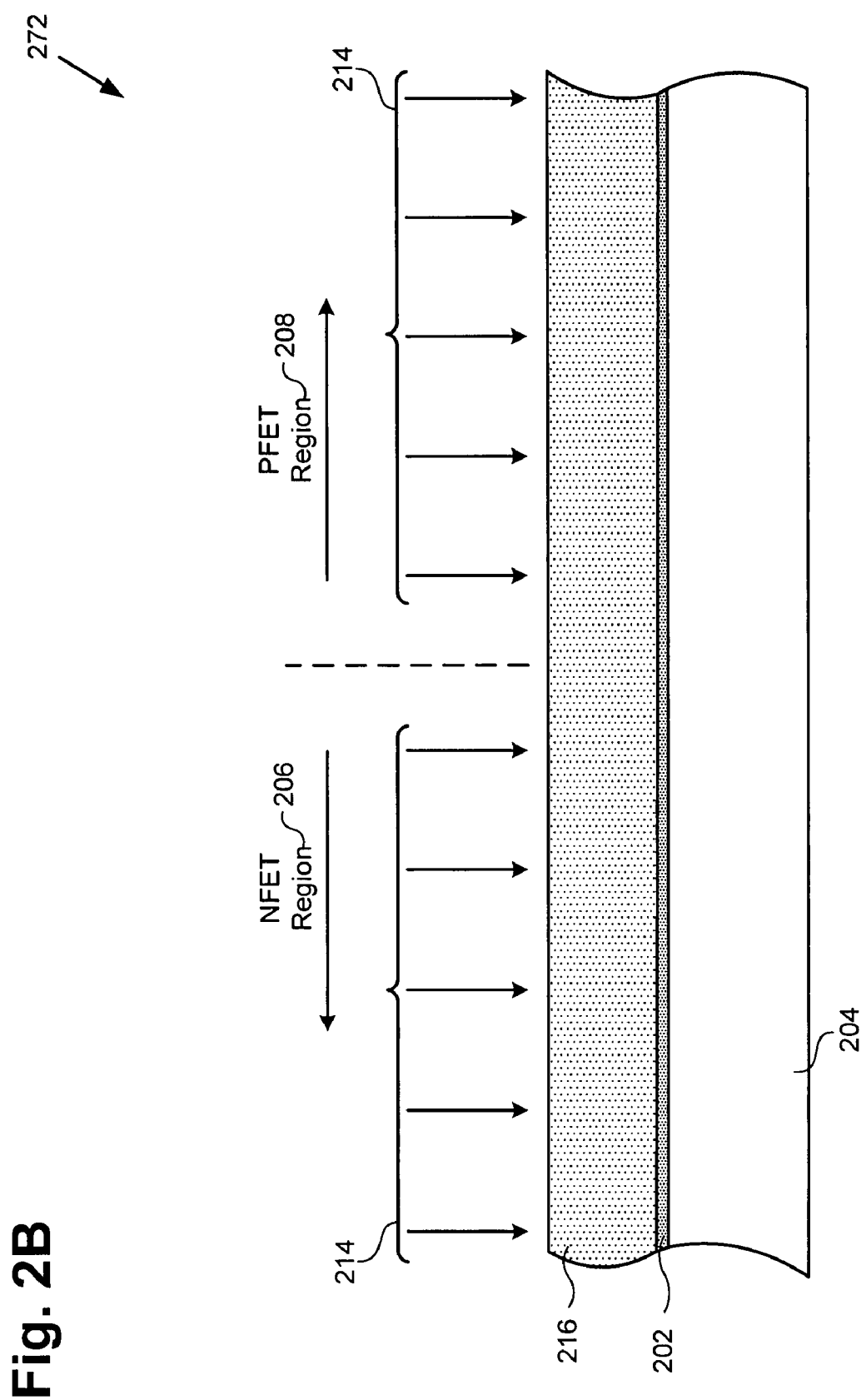
FIG. 2B illustrates a cross-sectional view, which includes a portion of a wafer processed according to an embodiment of the invention, corresponding to an intermediate step in the flowchart in FIG. 1.

The present invention is directed to a method for forming a reduced resistivity poly gate and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

The present invention involves a method for forming a reduced resistivity polycrystalline silicon gate, or, in general, a reduced resistivity gate made from a polycrystalline form of a semiconductor material, hereinafter also referred to as a poly gate, for use in a P-channel field effect transistor ("PFET"). As will be discussed in detail below, the present invention achieves and discloses an innovative process whereby a refractory metal, such as molybdenum, is utilized in a poly gate comprising a boron-fluoride compound, such as $BF_2$, $BF_2+$, or the like, to retard fluorine diffusion, thereby causing a titanium silicide segment in the poly gate to have reduced resistivity. It is noted that to preserve brevity only one poly gate is shown in a PFET region of a semiconductor substrate in the present application to illustrate various embodiments of the invention. However, the present invention can be utilized to form multiple reduced resistivity poly gates in PFET regions of a semiconductor substrate.

FIG. 1 shows a flowchart illustrating a method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 170 through 176 indicated in flowchart 100 are sufficient to describe one embodiment of the present invention; however, other embodiments of the invention may utilize steps different from those shown in flowchart 100. It is noted that the processing steps shown in flowchart 100 are performed on a portion of a processed semiconductor wafer, which, prior to step 170, includes, among other things, a semiconductor substrate having NFET ("N-channel field effect transistor") and PFET ("P-channel field effect transistor") regions, where the NFET and PFET regions can include a number of isolation regions, such as field oxide regions or shallow trench isolation (STI) regions, situated in the semiconductor substrate. In the present application, an NFET region refers to a region of the semiconductor substrate wherein one or more NFETs, such as N-channel metal oxide semiconductor (NMOS) transistors, can be formed and a PFET region refers to a region of the semiconductor substrate wherein one or more PFETs, such as P-channel metal oxide semiconductor (PMOS) transistors, can be formed.

Moreover, structures 270 through 276 in FIGS. 2A through 2D illustrate the result of performing steps 170 through 176 of flowchart 100, respectively. For example, structure 270 shows a semiconductor structure after processing step 170, structure 272 shows structure 270 after the processing of step 172, structure 274 shows structure 272 after the processing of step 174, and so forth. The process illustrated in flowchart 100 can be referred to as a "single gate" CMOS process, wherein N type gates, i.e., gates having an N type dopant, are formed in both NFET and PFET regions of the semiconductor substrate.

Referring now to FIG. 2A, structure 270 of FIG. 2A is a structure including a semiconductor substrate, after completion of step 170 of flowchart 100 in FIG. 1. In structure 270, gate dielectric layer 202 is situated over semiconductor substrate 204, which includes NFET region 206 and PFET region 208. Gate dielectric layer 202 can comprise silicon oxide or other suitable dielectric material and can be formed on semiconductor substrate 204 by utilizing a thermal oxidation process, a chemical vapor deposition (CVD) process or other suitable processes as known in the art. Semiconductor substrate 204, which can comprise silicon or other suitable semiconductor material, can include isolation regions (not shown in FIG. 2A), such as field oxide regions or STI regions, in NFET region 206 and PFET region 208. Also in structure 270, polycrystalline silicon layer 210 (or a layer formed by a polycrystalline form of other semiconductor materials), hereinafter also referred to as poly layer 210, is situated over gate dielectric layer 202. Poly layer 210 can be formed, for example, by utilizing a CVD process or other suitable deposition process to deposit a layer of polycrystalline silicon over gate dielectric layer 202.

Referring now to step 170 in FIG. 1 and structure 270 in FIG. 2A, at step 170 of flowchart 100, N type implant 212 is performed in NFET region 206 and PFET region 208 of semiconductor substrate 204 to form an N type poly layer by implanting an N type dopant in poly layer 210. N type implant 212 can include arsenic, phosphorus, or other suitable N type dopant and can be performed in a manner known in the art. The result of step 170 of flowchart 100 is illustrated by structure 270 in FIG. 2A.

Referring to step 172 in FIG. 1 and structure 272 in FIG. 2B, at step 172 of flowchart 100, refractory metal implant 214 is performed in NFET region 206 and PFET region 208 to implant a refractory metal, such as molybdenum, in N type poly layer 216. For example, in refractory metal implant 214, molybdenum can be implanted in N type poly layer 216 at an implantation energy of approximately 40.0 kilo-electron volts (KeV). Also in refractory metal implant 214, molybdenum can be implanted with an effective dose or concentration of, for example, between approximately $3.0 \times 10^{12}$ atoms/cm$^2$ and approximately $1.0 \times 10^{13}$ atoms/cm$^2$. The result of step 172 of flowchart 100 is illustrated by structure 272 in FIG. 2B.

Figure 2C:
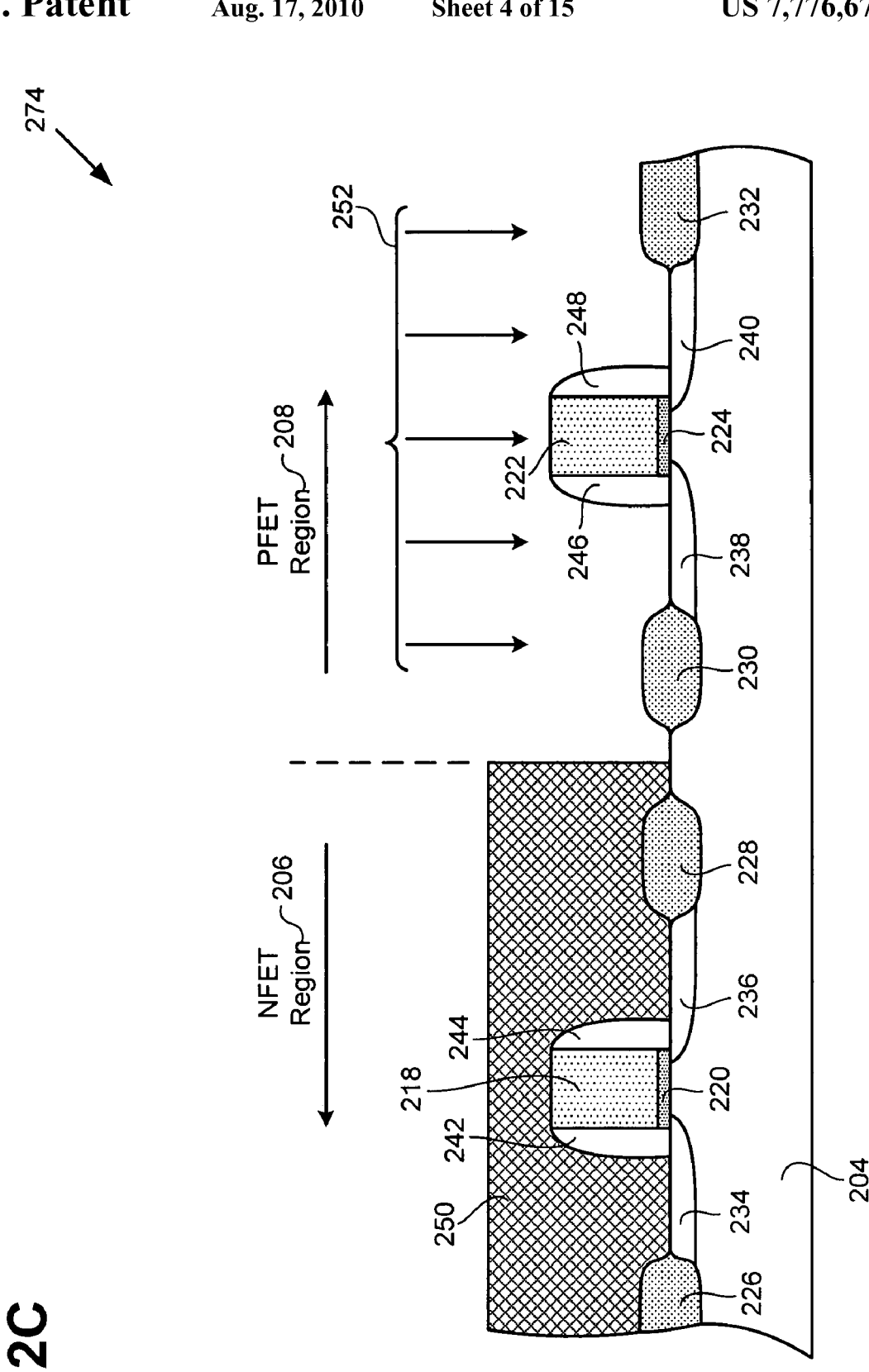
FIG. 2C illustrates a cross-sectional view, which includes a portion of a wafer processed according to an embodiment of the invention, corresponding to an intermediate step in the flowchart in FIG. 1.

Referring now to FIG. 2C, structure 274 of FIG. 2C shows a structure after completion of step 174 of flowchart 100 in FIG. 1. After complete of step 174 of flowchart 100, N type poly layer 216 and gate dielectric layer 202 are patterned to form N type gate 218 overlying gate dielectric segment 220 in NFET region 206 and N type gate 222 overlying gate dielectric segment 224 in PFET region 208. In structure 274, N type gate 218, which comprises N type poly, is situated over semiconductor substrate 204 between isolation regions 226 and 228 in NFET region 206 and N type gate 222, which also comprises N type poly, is situated over semiconductor substrate 204 between isolation regions 230 and 232 in PFET region 208. Isolation regions 226, 228, 230, and 232 can comprise silicon oxide or other suitable dielectric material and can be, for example, field oxide or STI regions.

Also in structure 274, source/drain regions 234 and 236 are situated in semiconductor substrate 204 adjacent to the respective sides of N type gate 218 and source/drain regions 238 and 240 are situated in semiconductor substrate 204 adjacent to the respective sides of N type gate 222. Source/drain regions 234, 236, 238, and 240 can be formed in semiconductor substrate 204 in a manner known in the art. Further in structure 274, spacers 242 and 244 are situated adjacent to the respective sides of N type gate 218 and spacers 246 and 248 are situated adjacent to the respective sides of N type gate 222. Spacers 242, 244, 246, and 248 can comprise silicon oxide or other suitable dielectric material and can be formed in a manner known in the art.

Continuing with reference to structure 274 in FIG. 2C, at step 174 of flowchart 100 of FIG. 1, mask 250 is formed over NFET region 206 of semiconductor substrate 204 and boron-fluoride compound implant 252 is performed in PFET region 208 of semiconductor substrate 204. In boron-fluoride compound implant 252, a boron-fluoride compound, such as boron difluoride ($BF_2$), $BF_2+$, or the like, which is a P type dopant, is implanted in N type gate 222 and in source/drain regions 238 and 240 in PFET region 208. Boron-fluoride compound implant 252 can be performed at a suitable implantation energy and dose as is known in the art. Mask 250 can comprise photoresist or other suitable masking material. The result of step 174 of flowchart 100 is illustrated by structure 274 in FIG. 2C.

Figure 2D:
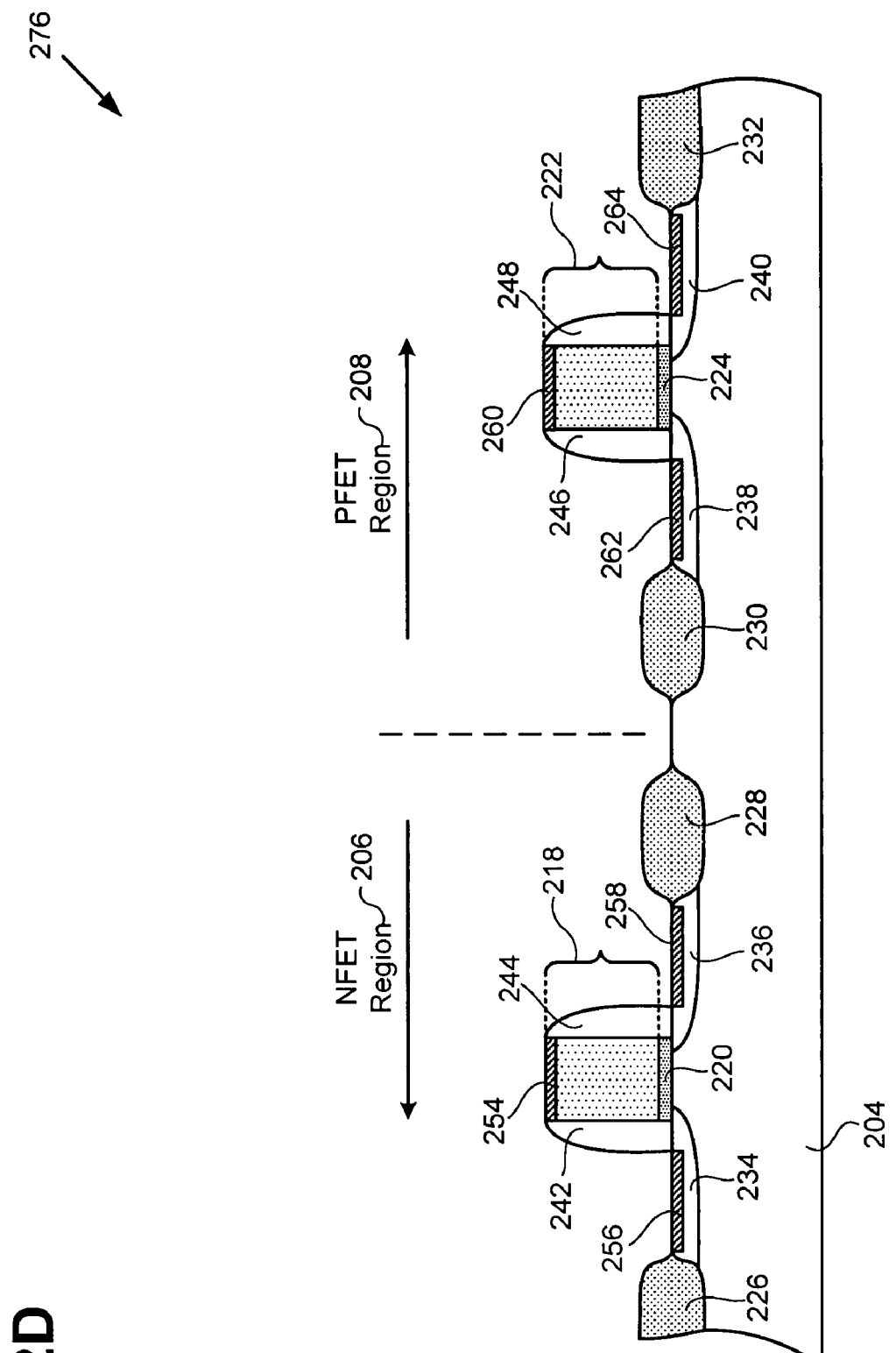
FIG. 2D illustrates a cross-sectional view, which includes a portion of a wafer processed according to an embodiment of the invention, corresponding to a final step in the flowchart in FIG. 1.

Referring now to step 176 in FIG. 1 and structure 276 in FIG. 2D, at step 176 of flowchart 100, mask 250 (shown in FIG. 2C) is removed from NFET region 206, respective titanium silicide ($TiSi_2$) segments 254, 256, and 258 are formed in N type gate 218 and in source/drain regions 234 and 236 in NFET region 206, and respective titanium silicide segments 260, 262, and 264 are formed in N type gate 222 and in source/drain regions 238 and 240 in PFET region 208. Mask 250 (shown in FIG. 2C) can be removed by utilizing a suitable etch process. In NFET region 206, an NFET including N type gate 218, gate dielectric segment 220, source/drain regions 234 and 236, and spacers 242 and 244, is formed on semiconductor substrate 204, and in PFET region 208, a PFET including N type gate 222, gate dielectric segment 224, source/drain regions 238 and 240, and spacers 246 and 248, is formed on semiconductor substrate 204.

Prior to the formation of titanium silicide segments 254, 256, 258, 260, 262, and 264, a source/drain annealing can be performed to activate N type dopant in source/drain regions 234 and 236 in NFET region 206 and to activate P type dopant in source/drain regions 238 and 240 in PFET region 208. During the source/drain annealing, the boron-fluoride compound that was implanted into N type gate 222 in PFET region 208 can dissociate into boron and fluorine. Without the present invention's refractory metal implant (i.e. in a conventional fabrication process), the fluorine, which tends to diffuse along polycrystalline grain boundaries, can form voids and bubbles in the titanium silicide segment formed in a poly gate, such as N type gate 222 in PFET region 208. The voids and bubbles formed in the titanium silicide segment can cause increased sheet resistance and large variations in sheet resistance in the titanium silicide segment, which can cause a corresponding undesirable increase in poly gate resistivity.

However, in the embodiment of the invention in FIGS. 1 and 2A through 2D, a refractory metal, such as molybdenum, is implanted in the N type poly layer that is patterned to form N type gate 222 in PFET region 208. The refractory metal, such as molybdenum, can retard fluorine diffusion in N type gate 222, thereby significantly reducing the formation of voids and bubbles in the titanium silicide segment (i.e. titanium silicide segment 260) subsequently formed in N type gate 222. As a result of the implanted refractory metal, the sheet resistance of titanium silicide segment 260 can be significantly reduced. For example, implanted molybdenum can reduce the sheet resistance of a titanium silicide segment, such as titanium silicide segment 260, by approximately 50 percent.

Also, the implanted refractory metal can cause a significant reduction in sheet resistance variation of titanium silicide segment 260. For example, implanted molybdenum can reduce sheet resistance variation of a titanium silicide segment, such as titanium silicide segment 260, from between approximately 2.0 ohms per square (ohms/sq.) and approximately 5.0 ohms/sq. to between approximately 2.0 ohms/sq. and approximately 2.5 ohms/sq. By causing a significant reduction in sheet resistance of titanium silicide segment 260, various embodiments of the present invention advantageously cause a corresponding reduction in the resistivity of N type gate 222 in PFET region 208. By implanting a refractory metal, such as molybdenum, in an N type poly layer prior to gate formation, the embodiment of the invention in FIGS. 1 and 2A through 2D also avoids implantation of the refractory metal in the semiconductor substrate.

The sheet resistance of titanium silicide segments 262 and 264, which are formed in silicon in respective source/drain regions 238 and 240 in semiconductor substrate 204, is not significantly changed by the refractory metal implant. Thus, the sheet resistance of titanium silicide segments 262 and 264 is not significantly different with or without the refractory metal implant. Conventionally, a refractory metal, such as molybdenum, has been utilized in substrate silicon to provide a relatively small reduction in titanium silicide resistance. In contrast, the present invention utilizes a refractory metal, such as molybdenum, to achieve a significant reduction in sheet resistance in a titanium silicide segment formed in a poly gate that has been implanted with a boron-fluoride compound, such as boron difluoride ($BF_2$), $BF_2$+, or the like, thereby providing a poly gate having a significantly reduced resistivity. Also, by utilizing the refractory metal, the present invention achieves a significant reduction in sheet resistance variation in the titanium silicide segment formed in the poly gate implanted with the boron-fluoride compound.

Figure 3:
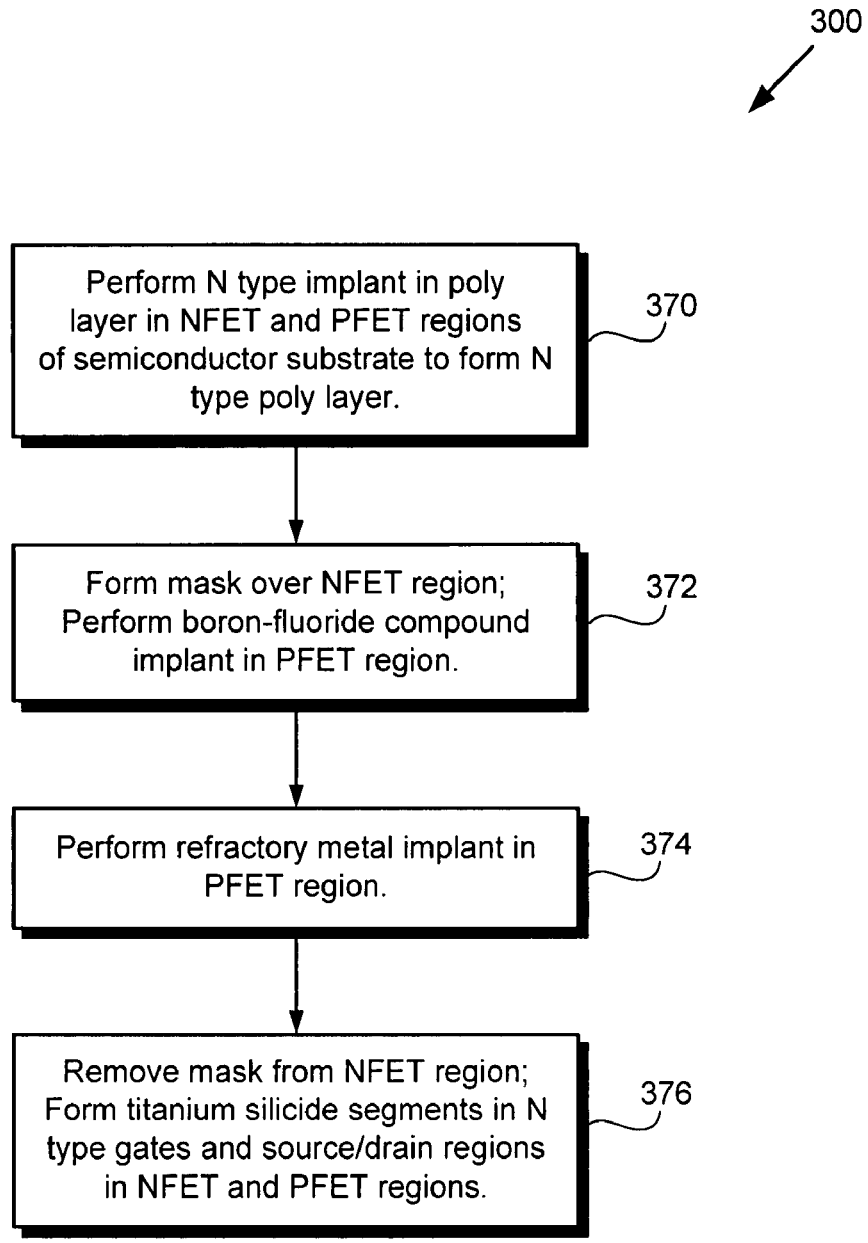
FIG. 3 shows a flowchart illustrating the steps taken to implement an embodiment of the present invention.

FIG. 3 shows a flowchart illustrating a method according to an embodiment of the present invention. Certain details and features have been left out of flowchart 300 that are apparent to a person of ordinary skill in the art. For example, a step may consist of one or more substeps or may involve specialized equipment or materials, as known in the art. Steps 370 through 376 indicated in flowchart 300 are sufficient to describe one embodiment of the present invention; however, other embodiments of the invention may utilize steps different from those shown in flowchart 300. It is noted that the processing steps shown in flowchart 300 are performed on a portion of processed wafer, which, prior to step 370, includes, among other things, a semiconductor substrate having NFET and PFET regions, where the NFET and PFET regions can include a number of isolation regions, such as field oxide regions or STI regions, situated in the semiconductor substrate.

Moreover, structures 470 through 476 in FIGS. 4A through 4D illustrate the result of performing steps 370 through 376 of flowchart 300, respectively. For example, structure 470 shows a semiconductor structure after processing step 370, structure 472 shows structure 470 after the processing of step 372, structure 474 shows structure 472 after the processing of step 374, and so forth. Similar to the process in flowchart 100 in FIG. 1, the process illustrated in flowchart 300 can also be referred to as a single gate CMOS process, wherein N type gates are formed in both NFET and PFET regions of the semiconductor substrate.

Figure 4A:
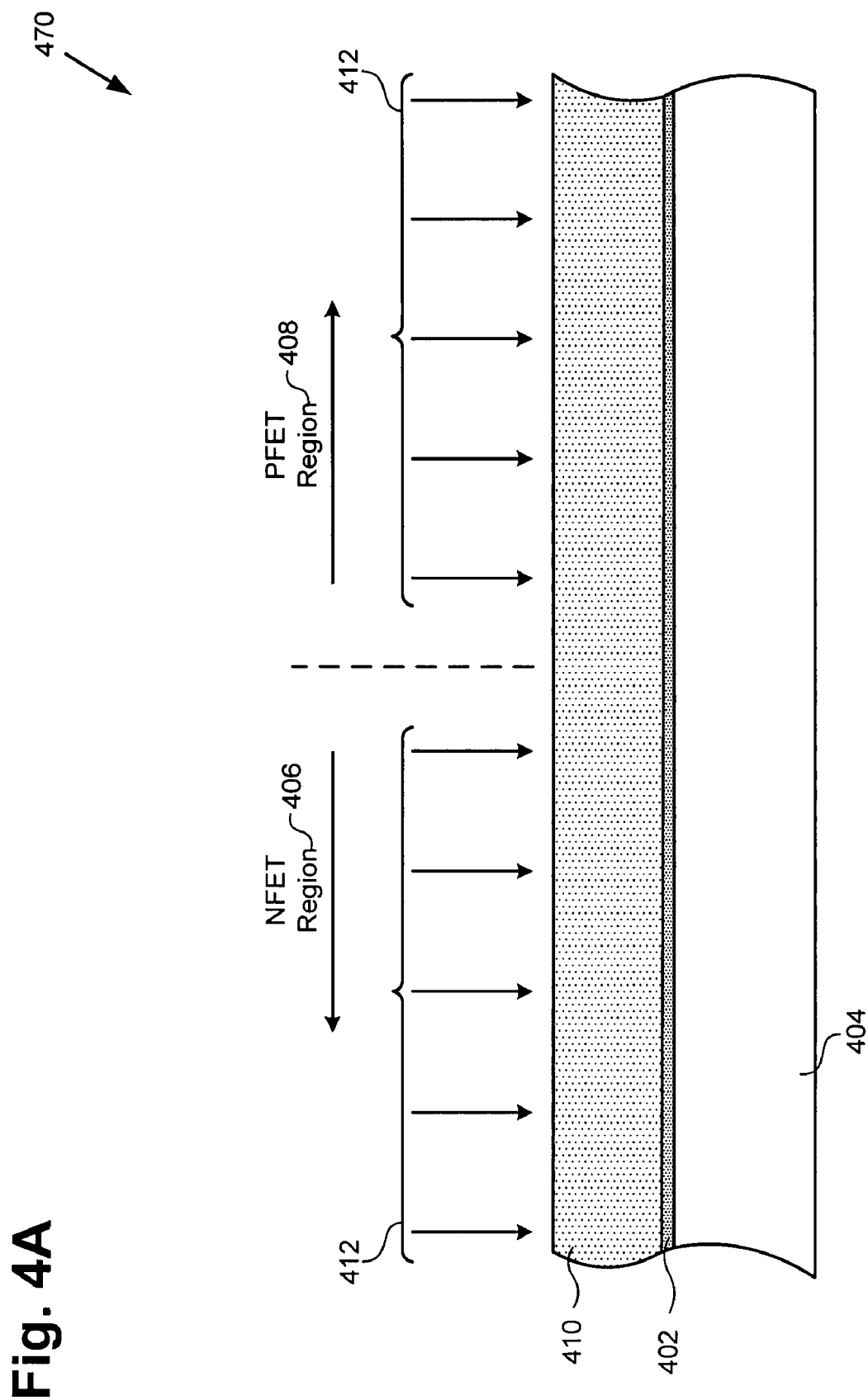
FIG. 4A illustrates a cross-sectional view, which includes a portion of a wafer processed according to an embodiment of the invention, corresponding to an initial step in the flowchart in FIG. 3.

Referring now to FIG. 4A, structure 470 of FIG. 4A shows a structure including a semiconductor substrate, after completion of step 370 of flowchart 300 in FIG. 3. In structure 470, gate dielectric layer 402, semiconductor substrate 404 and poly layer 410 correspond, respectively, to gate dielectric layer 202, semiconductor substrate 204 and poly layer 210 in structure 270 in FIG. 2A. In structure 470, gate dielectric layer 402 is situated over semiconductor substrate 404 and poly layer 410 is situated over gate dielectric layer 402 in NFET region 406 and PFET region 408 of semiconductor substrate 404.

Referring now to step 370 in FIG. 3 and structure 470 in FIG. 4A, at step 370 of flowchart 300, N type implant 412 is performed to form an N type poly layer in NFET region 406 and PFET region 408 of semiconductor substrate 404 by implanting an N type dopant in poly layer 410. N type implant 412 can include arsenic, phosphorus, or other suitable N type dopant and can be performed in a manner known in the art. The result of step 370 of flowchart 300 is illustrated by structure 470 in FIG. 4A.

Figure 4B:
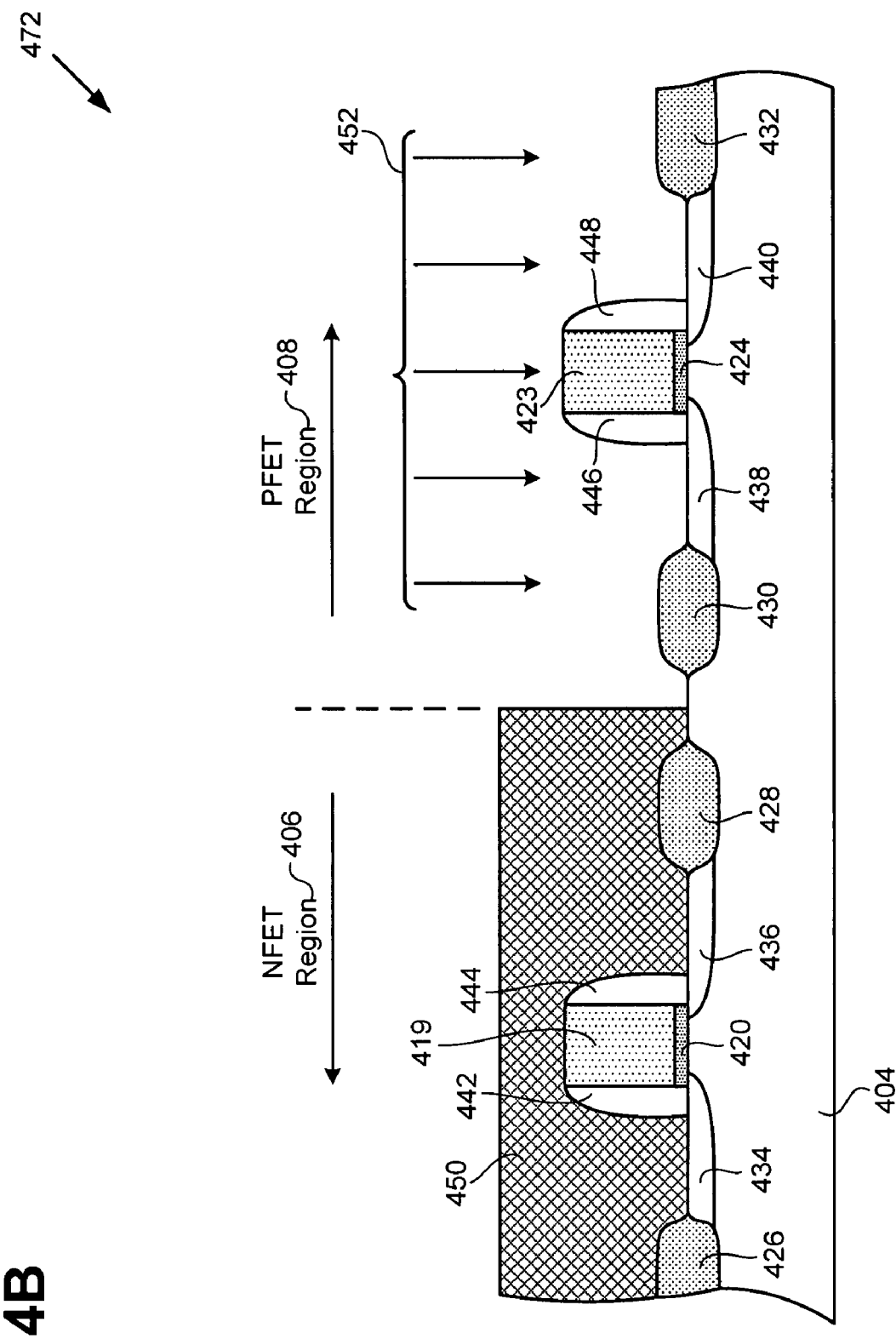
FIG. 4B illustrates a cross-sectional view, which includes a portion of a wafer processed according to an embodiment of the invention, corresponding to an intermediate step in the flowchart in FIG. 3.

Referring now to FIG. 4B, structure 472 of FIG. 4B shows a structure after completion of step 372 of flowchart 300 in FIG. 3. In structure 472, gate dielectric segments 420 and 424, isolation regions 426, 428, 430, and 432, source/drain regions 434, 436, 438, and 440, and spacers 442, 444, 446, and 448 correspond, respectively, to gate dielectric segments 220 and 224, isolation regions 226, 228, 230, and 232, source/drain regions 234, 236, 238, and 240, and spacers 242, 244, 246, and 248 in structure 274 in FIG. 2C. After complete of step 370 of flowchart 300, the N type poly layer, which was formed by implanting poly layer 410 with an N type dopant, and gate dielectric layer 402 are patterned to form N type gate 419 overlying gate dielectric segment 420 in NFET region 406 and N type gate 423 overlying gate dielectric segment 424 in PFET region 408.

In structure 472, N type gate 419, which comprises N type poly, is situated over semiconductor substrate 404 between isolation regions 426 and 428 in NFET region 406 and N type gate 423, which also comprises N type poly, is situated over semiconductor substrate 404 between isolation regions 430 and 432 in PFET region 408. Also in structure 472, source/drain regions 434 and 436 are situated in semiconductor substrate 404 adjacent to the respective sides of N type gate 219 and source/drain regions 438 and 440 are situated in semiconductor substrate 404 adjacent to the respective sides of N type gate 423. Further in structure 472, spacers 442 and 444 are situated adjacent to the respective sides of N type gate 219 and spacers 446 and 448 are situated adjacent to the respective sides of N type gate 223.

Referring to step 372 in FIG. 3 and structure 472 in FIG. 4B, at step 372 of flowchart 300, mask 450 is formed over NFET region 406 of semiconductor substrate 404 and boron-fluoride compound implant 452 is performed in PFET region 408 of semiconductor substrate 404. Boron-fluoride compound implant 452, which corresponds to boron-fluoride compound implant 252 in FIG. 2C, is implanted into N type gate 423 and into source/drain regions 438 and 440 in PFET region 408. As a result of boron-fluoride compound implant 452, heavily doped P type source/drain regions are formed in PFET region 408. Mask 450 prevents boron-fluoride compound implant 452 from being implanted in NFET region 406. Mask 450 can comprise photoresist or other suitable masking material. The result of step 372 of flowchart 300 is illustrated by structure 472 in FIG. 4B.

Figure 4C:
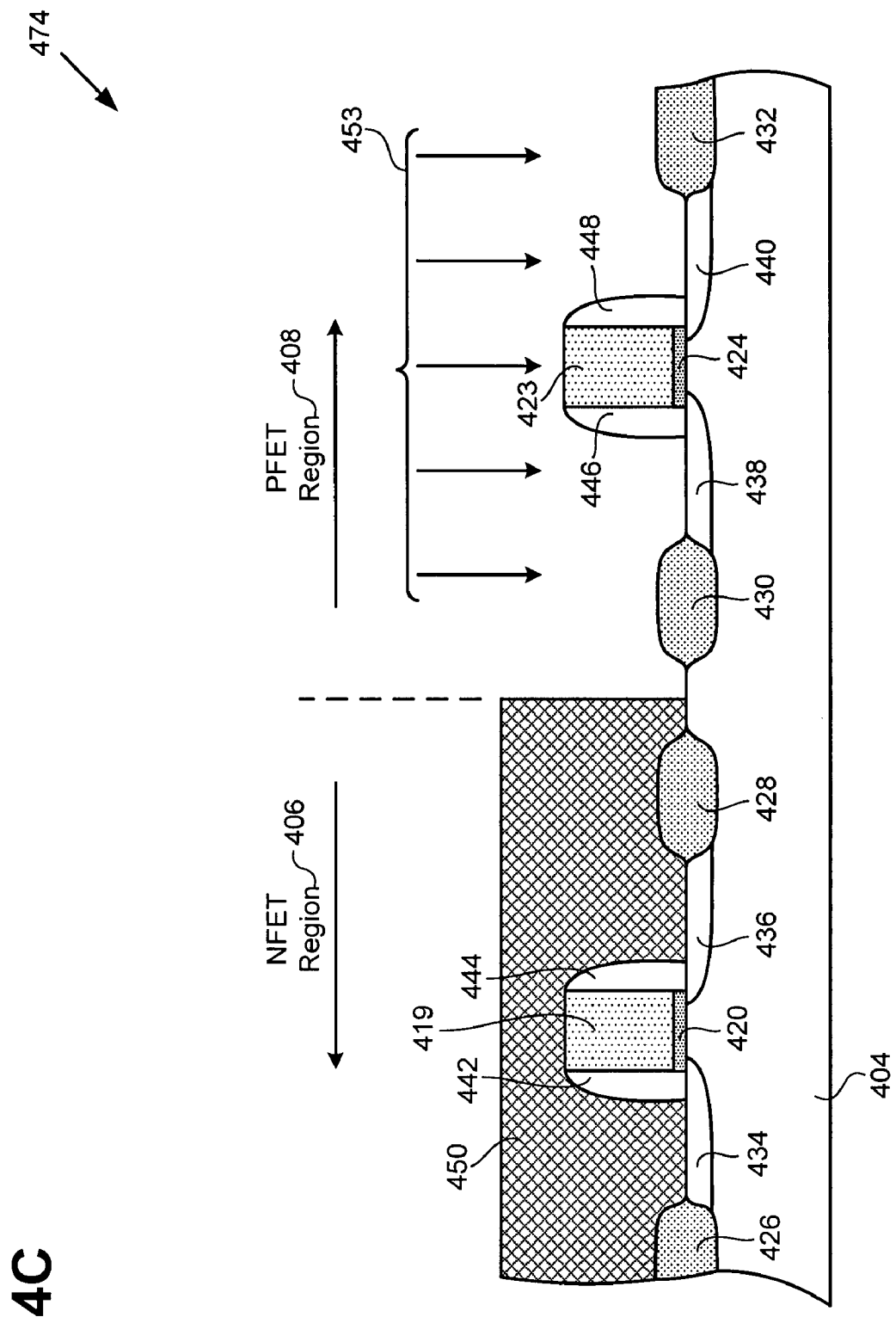
FIG. 4C illustrates a cross-sectional view, which includes a portion of a wafer processed according to an embodiment of the invention, corresponding to an intermediate step in the flowchart in FIG. 3.

Referring to step 374 in FIG. 3 and structure 474 in FIG. 4C, at step 374 of flowchart 300, refractory metal implant 453 is performed in PFET region 408 of semiconductor substrate 404. As a result of refractory metal implant 453, a refractory metal, such molybdenum, is implanted in N type gate 423 and source/drain regions 438 and 440 in semiconductor substrate 404 in PFET region 408. For example, in refractory metal implant 453, molybdenum can be implanted in N type gate 423 at an implantation energy of approximately 40.0 kilo-electron volts (KeV). Also in refractory metal implant 453, molybdenum can be implanted in N type gate 423 with an effective dose or concentration of, for example, between approximately $3.0 \times 10^{12}$ atoms/cm$^2$ and approximately $1.0 \times 10^{13}$ atoms/cm$^2$. Mask 450 can prevent the refractory metal from being implanted in NFET region 406. The result of step 374 of flowchart 300 is illustrated by structure 474 in FIG. 4C.

Referring to step 376 in FIG. 3 and structure 476 in FIG. 4D, at step 376 of flowchart 300, mask 450 (shown in FIGS. 4B and 4C) is removed from NFET region 406, respective titanium silicide (TiSi$_2$) segments 454, 456, and 458 are formed in N type gate 419 and source/drain regions 434 and 436 in NFET region 406, and respective titanium silicide segments 460, 462, and 464 are formed in N type gate 423 and source/drain regions 438 and 440 in PFET region 408. Titanium silicide segments 454, 456, 458, 460, 462, and 464 correspond, respectively, to titanium silicide segments 254, 256, 258, 260, 262, and 264 in structure 276 in FIG. 2D. Mask 450 (shown in FIGS. 4B and 4C) can be removed by utilizing a suitable etch process as is known in the art. In NFET region 406, an NFET including N type gate 419, gate dielectric segment 420, source/drain regions 434 and 436, and spacers 442 and 444, is formed on semiconductor substrate 404, and in PFET region 408, a PFET including N type gate 423, gate dielectric segment 424, source/drain regions 438 and 440, and spacers 446 and 448, is formed on semiconductor substrate 404.

Prior to the formation of titanium silicide segments 454, 456, 458, 460, 462, and 464, a source/drain annealing can be performed to activate N type dopant in source/drain regions 434 and 436 in NFET region 406 and to activate P type dopant in source/drain regions 438 and 440 in PFET region 408. During the source/drain annealing, the boron-fluoride compound that was implanted into N type gate 423 in PFET region 408 can dissociate into boron and fluorine. Without the present invention's refractory metal implant, the fluorine, which tends to diffuse along polycrystalline grain boundaries, can form voids and bubbles in the titanium silicide segment formed in a poly gate, such as N type gate 423 in PFET region 408. As discussed above, the voids and bubbles formed in the titanium silicide segment can cause increased sheet resistance and large variations in sheet resistance in the titanium silicide segment, which can cause a corresponding undesirable increase in poly gate resistivity.

However, in the embodiment of the invention in FIGS. 3 and 4A through 4D, a refractory metal, such as molybdenum, is implanted in N type gate 423 in PFET region 408. The refractory metal can retard fluorine diffusion in N type gate 423, thereby significantly reducing the formation of voids and bubbles in the titanium silicide segment (i.e. titanium silicide segment 460) formed in N type gate 423. As a result of the implanted refractory metal, the embodiment of the invention in FIGS. 3 and 4A through 4D achieves similar advantages as discussed above in the embodiment of the invention in FIGS. 1 and 2A through 2D, such as a reduced resistivity poly gate. In contrast to the embodiment of the invention in FIGS. 1 and 2A through 2D, in the embodiment of the invention in FIGS. 3 and 4A through 4D, the refractory metal implant is performed only in PFET region 408 (not in NFET region 406) and is also performed after N type gate 423 has been formed. As a result, in the embodiment of the invention in FIGS. 3 and 4A through 4D, NFET region 406 does not receive the refractory metal implant.

FIG. 5 shows a flowchart illustrating a method according to another embodiment of the present invention. Certain details and features have been left out of flowchart 500 that are apparent to a person of ordinary skill in the art. For example, a step may consist of one or more substeps or may involve specialized equipment or materials, as known in the art. Steps 570 through 576 indicated in flowchart 500 are sufficient to describe one embodiment of the present invention; however, other embodiments of the invention may utilize steps different from those shown in flowchart 500. It is noted that the processing steps shown in flowchart 500 are performed on a portion of processed wafer, which, prior to step 570, includes, among other things, a semiconductor substrate having NFET and PFET regions, where each of the NFET and PFET regions can include isolation regions situated in the semiconductor substrate, a poly gate formed between the isolation regions and overlying a gate dielectric segment, and source/drain regions situated in the semiconductor substrate adjacent to the poly gate.

Moreover, structures 670 through 676 in FIGS. 6A through 6D illustrate the result of performing steps 570 through 576 of flowchart 500, respectively. For example, structure 670 shows a semiconductor structure after processing step 570, structure 672 shows structure 670 after the processing of step 572, structure 674 shows structure 672 after the processing of step 574, and so forth. In contrast to the processes illustrated in flowchart 100 in FIG. 1 and in flowchart 300 in FIG. 3, the process illustrated in flowchart 500 can be referred to as a dual gate CMOS process, wherein N type gates are formed in an NFET region of a semiconductor substrate and P type gates, i.e., poly gates comprising a P type dopant in place of an N type dopant, are formed in a PFET region of the semiconductor substrate.

Figure 6A:
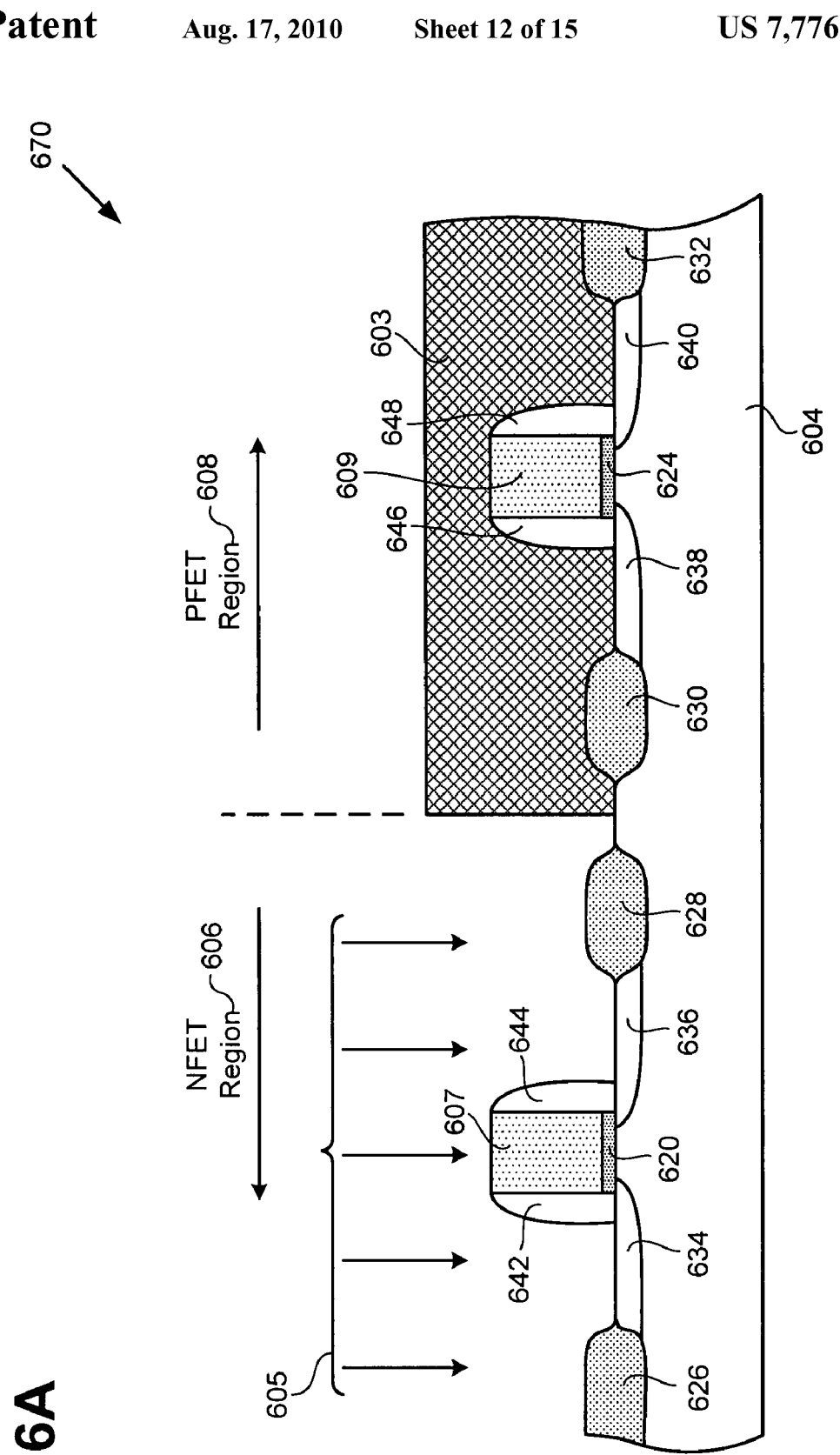
FIG. 6A illustrates a cross-sectional view, which includes a portion of a wafer processed according to an embodiment of the invention, corresponding to an initial step in the flowchart in FIG. 5.

Referring now to FIG. 6A, structure 670 of FIG. 6A shows a structure after completion of step 570 of flowchart 500 in FIG. 5. In structure 670, gate dielectric segments 620 and 624, isolation regions 626, 628, 630, and 632, source/drain regions 634, 636, 638, and 640, and spacers 642, 644, 646, and 648 correspond, respectively, to gate dielectric segments 220 and 224, isolation regions 226, 228, 230, and 232, source/drain regions 234, 236, 238, and 240, and spacers 242, 244, 246, and 248 in structure 274 in FIG. 2C. In structure 670, gate poly segment 607 is situated over semiconductor substrate 604 between isolation regions 626 and 628 in NFET region 606 and gate poly segment 609 is situated over semiconductor substrate 604 between isolation regions 630 and 632 in PFET region 608.

Also in structure 670, source/drain regions 634 and 636 are situated in semiconductor substrate 604 adjacent to the respective sides of gate poly segment 607 and source/drain regions 638 and 640 are situated in semiconductor substrate 604 adjacent to the respective sides of gate poly segment 609. Further in structure 670, spacers 642 and 644 are situated adjacent to the respective sides of gate poly segment 607 and spacers 646 and 648 are situated adjacent to the respective sides of gate poly segment 609. Also in structure 670, gate poly 607 is situated over gate dielectric segment 620 and gate poly segment 609 is situated over gate dielectric segment 624. Gate poly segments 607 and 609 can be formed by patterning a poly layer, such as poly layer 210 in FIG. 2A, in a manner known in the art.

Referring now to step 570 in FIG. 5 and structure 670 in FIG. 6A, at step 570 of flowchart 500, mask 603 is formed over PFET region 608 and N type implant 605 is performed in NFET region 606. N type implant 605 is performed to implant an N type dopant, such as, for example, arsenic or phosphorus, in gate poly segment 607 so as to form an N type gate. N type implant 605 is also performed to heavily dope source/drain regions 634 and 636 with the N type dopant. Mask 603, which can comprise photoresist or other suitable masking material, is formed over PFET region 608 to prevent N type dopant in N type implant 605 from being implanted in the PFET region. The result of step 570 of flowchart 500 is illustrated by structure 670 in FIG. 6A.

Figure 6B:
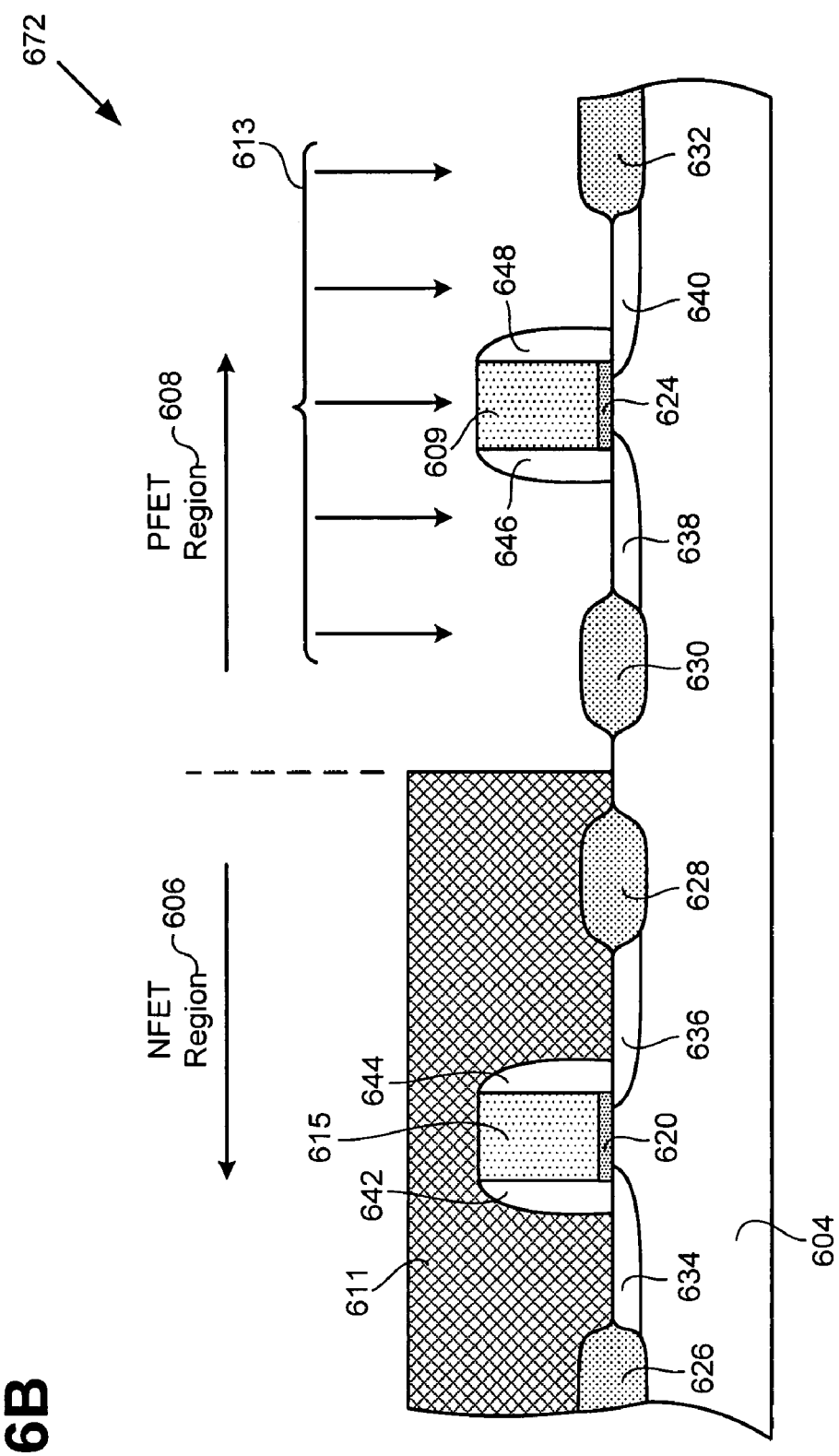
FIG. 6B illustrates a cross-sectional view, which includes a portion of a wafer processed according to an embodiment of the invention, corresponding to an intermediate step in the flowchart in FIG. 5.

Referring to step 572 in FIG. 5 and structure 672 in FIG. 6B, at step 572 of flowchart 500, mask 603 (shown in FIG. 6A) is removed from PFET region 608, mask 611 is formed over NFET region 606, and boron-fluoride compound implant 613 is performed in PFET region 608. Mask 603 can be removed by utilizing a suitable etch process as known in the art. Mask 611 can protect NFET region 606 from boron-fluoride compound implant 613 and can comprise photoresist or other suitable masking material. Mask 611 is situated over N type gate 615, which was formed by implanting an N type dopant into gate poly segment 607 (shown in FIG. 6A) at step 570 of flowchart 500. Boron-fluoride compound implant 613, which corresponds to boron-fluoride compound implant 252 in FIG. 2C, can comprise a boron-fluoride compound, such as $BF_2$, $BF_2+$, or the like, and is implanted into gate poly segment 609 so as to form a P type gate and is implanted into source/drain regions 638 and 640 to form heavily doped P type source/drain regions. The result of step 572 of flowchart 500 is illustrated by structure 672 in FIG. 6B.

Figure 6C:
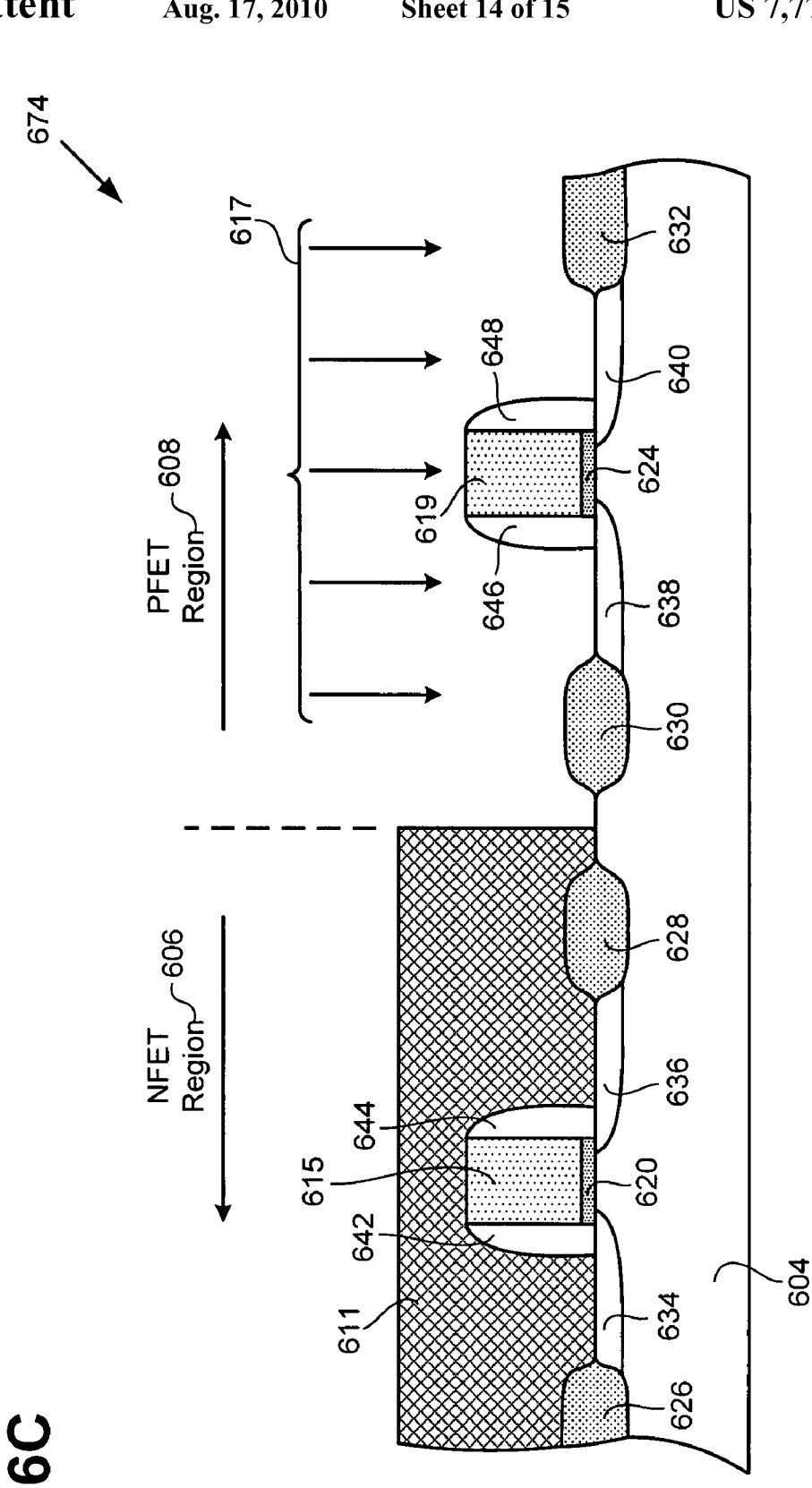
FIG. 6C illustrates a cross-sectional view, which includes a portion of a wafer processed according to an embodiment of the invention, corresponding to an intermediate step in the flowchart in FIG. 5.

Referring to step 574 in FIG. 5 and structure 674 in FIG. 6C, at step 574 of flowchart 500, refractory metal implant 617 is performed in PFET region 608 of semiconductor substrate 604. In refractory metal implant 617, a refractory metal, such as molybdenum, is implanted in P type gate 619, which was formed by implanting a boron-fluoride compound, such as $BF_2$, $BF_2+$, or the like, into gate poly segment 609 (shown in FIGS. 6A and 6B) at step 572 of flowchart 500. The refractory metal is also implanted in source/drain regions 638 and 640 in PFET region 608. For example, in refractory metal implant 617, molybdenum can be implanted in P type gate 619 at an implantation energy of approximately 40.0 kilo-electron volts (KeV). Also in refractory metal implant 617, molybdenum can be implanted in P type gate 619 with an effective dose or concentration of, for example, between approximately $3.0\times10^{12}$ atoms/cm$^2$ and approximately $1.0\times10^{13}$ atoms/cm$^2$. Mask 611 can prevent the refractory metal from being implanted in NFET region 606. The result of step 574 of flowchart 500 is illustrated by structure 674 in FIG. 6C.

Figure 6D:
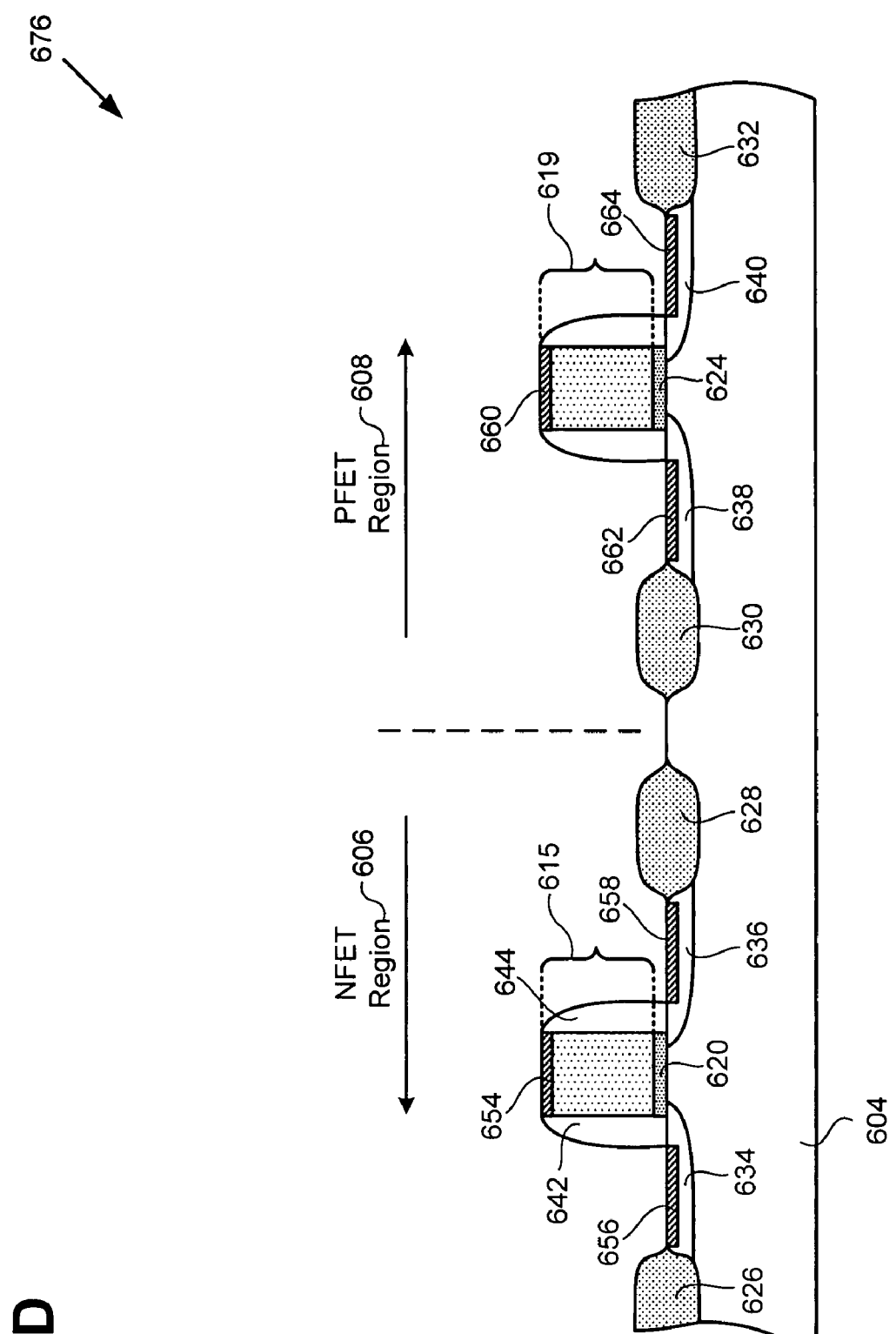
FIG. 6D illustrates a cross-sectional view, which includes a portion of a wafer processed according to an embodiment of the invention, corresponding to a final step in the flowchart in FIG. 5.

Referring to step 576 in FIG. 5 and structure 676 in FIG. 6D, at step 576 of flowchart 500, mask 611 (shown in FIGS. 6B and 6C) is removed from NFET region 606, respective titanium silicide ($TiSi_2$) segments 654, 656, and 658 are formed in N type gate 615 and source/drain regions 634 and 636 in NFET region 606, and respective titanium silicide segments 660, 662, and 664 are formed in P type gate 619 and source/drain regions 638 and 640 in PFET region 608. Titanium silicide segments 654, 656, 658, 660, 662, and 664 correspond, respectively, to titanium silicide segments 254, 256, 258, 260, 262, and 264 in structure 276 in FIG. 2D. Mask 611 (shown in FIGS. 6B and 6C) can be removed by utilizing a suitable etch process as is known in the art. In NFET region 606, an NFET including N type gate 615, gate dielectric segment 620, source/drain regions 634 and 636, and spacers 642 and 644, is formed on semiconductor substrate 604, and in PFET region 608, a PFET including P type gate 619, gate dielectric segment 624, source/drain regions 638 and 640, and spacers 646 and 648, is formed on semiconductor substrate 604.

Prior to the formation of titanium silicide segments 654, 656, 658, 660, 662, and 664, a source/drain annealing can be performed to activate N type dopant in source/drain regions 634 and 636 in NFET region 606 and to activate P type dopant in source/drain regions 638 and 640 in PFET region 608. During the source/drain annealing, the boron-fluoride compound that was implanted into P type gate 619 in PFET region 608 can dissociate into boron and fluorine. Without the present invention's refractory metal implant, the fluorine, which tends to diffuse along polycrystalline grain boundaries, can form voids and bubbles in the titanium silicide segment formed in a P type gate, such as P type gate 619 in PFET region 608. As discussed above, the voids and bubbles formed in the titanium silicide segment can cause increased sheet resistance and large variations in sheet resistance in the titanium silicide segment, which can cause a corresponding undesirable increase in poly gate resistivity.

However, in the embodiment of the invention in FIGS. 5 and 6A through 6D, a refractory metal, such as molybdenum, is implanted in P type gate 619 in PFET region 608. The refractory metal, such as molybdenum, can retard fluorine diffusion in a poly gate, such as P type gate 619, thereby significantly reducing the formation of voids and bubbles in the titanium silicide segment (i.e. titanium silicide segment 660) formed in the poly gate. As a result of the implanted refractory metal, the embodiment of the invention in FIGS. 5 and 6A through 6D achieves similar advantages as discussed above in the embodiment of the invention in FIGS. 1 and 2A through 2D, such as a reduced resistivity poly gate. In contrast to the embodiments of the invention in FIGS. 1 and 2A through 2D and FIGS. 3 and 4A through 4D, in the embodiment of the invention in FIGS. 5 and 6A through 6D, a titanium silicide segment is formed in a P type gate comprising poly that has been implanted with a refractory metal, such as molybdenum, and a boron-fluoride compound, such as $BF_2$, $BF_2+$, or the like, instead of performing the invention's process on an N type gate.

Thus, in the embodiments of the invention discussed above, a poly gate, such as an N type or P type gate, is formed in a PFET region of a semiconductor substrate, where the gate comprises a boron-fluoride compound, such as $BF_2$, $BF_2+$, or the like, and a refractory metal, such as molybdenum, and where the refractory metal retards fluorine diffusion in the poly gate. In the present invention, by utilizing a refractory metal to retard fluorine diffusion in a poly gate comprising a boron-fluoride compound, such as $BF_2$, $BF_2+$, or the like, a titanium silicide segment having significantly reduced sheet resistance and significantly reduced sheet resistance variation can be formed in the poly gate. As a result, the present invention advantageously achieves a poly gate having reduced resistivity.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, method for forming a reduced resistivity poly gate and related structure have been described.

The invention claimed is:

1. A method for forming a reduced resistivity poly gate, said method comprising steps of:
    implanting a refractory metal in an N type poly layer in a PFET region of a semiconductor substrate;
    implanting a boron-fluoride compound in an N type gate in said PFET region, said N type gate comprising a portion of said N type poly layer;
    forming a titanium silicide segment in said N type gate;
    wherein said refractory metal reduces a resistivity of said titanium silicide segment, thereby forming said reduced resistivity poly gate.

2. The method of claim 1, wherein said refractory metal comprises molybdenum.

3. The method of claim 1, wherein said boron-fluoride compound comprises boron difluoride.

4. The method of claim 1, wherein said step of implanting said refractory metal in said N type poly layer in said PFET region of said semiconductor substrate includes implanting said refractory metal in said N type poly layer in an NFET region of said semiconductor substrate.

5. The method of claim 2, wherein said molybdenum is implanted in said N type poly layer at a dose of between approximately $3.0 \times 10^{12}$ atoms/cm$^2$ and approximately $1.0 \times 10^{13}$ atoms/cm$^2$.

6. A method for forming a reduced resistivity poly gate, said method comprising steps of:
    implanting a boron-fluoride compound in an N type gate in a PFET region of a semiconductor substrate;
    implanting a refractory metal in said N type gate;
    forming a titanium silicide segment in said N type gate;
    wherein said refractory metal reduces a resistivity of said titanium silicide segment, thereby forming said reduced resistivity poly gate.

7. The method of claim 6, wherein said refractory metal comprises molybdenum.

8. The method of claim 6, wherein said boron-fluoride compound comprises boron difluoride.

9. The method of claim 6, wherein said step of implanting said refractory metal in said N type gate comprises implanting said refractory metal in a source/drain region situated adjacent to said N type gate.

10. The method of claim 7, wherein said molybdenum is implanted in said N type gate at a dose of between approximately $3.0 \times 10^{12}$ atoms/cm$^2$ and approximately $1.0 \times 10^{13}$ atoms/cm$^2$.

11. A method for forming a reduced resistivity poly gate, said method comprising steps of:
    implanting a boron-fluoride compound in a gate poly in a PFET region of a semiconductor substrate to form a P type gate;
    implanting a refractory metal in said P type gate;
    forming a titanium silicide segment in said P type gate;
    wherein said refractory metal reduces a resistivity of said titanium silicide segment, thereby forming said reduced resistivity poly gate.

12. The method of claim 11, wherein said refractory metal comprises molybdenum.

13. The method of claim 11, wherein said boron-fluoride compound comprises boron difluoride.

14. The method of claim 11, wherein said step of implanting said refractory metal in said I' type gate comprises implanting said refractory metal in a source/drain region situated adjacent to said P type gate.

15. The method of claim 12, wherein said molybdenum is implanted in said P type gate at a dose of between approximately $3.0 \times 10^{12}$ atoms/cm$^2$ and approximately $1.0 \times 10^{13}$ atoms/cm$^2$.

16. A PFET (P-channel Field Effect Transistor) comprising:
    a poly gate situated over a semiconductor substrate, said poly gate comprising poly including a boron-fluoride compound and a refractory metal implant;
    a titanium silicide segment situated in said poly gate;
    wherein said refractory metal causes said titanium silicide segment in said poly gate to have a reduced resistivity.

17. The PFET of claim 16, wherein said refractory metal comprises molybdenum.

18. The PFET of claim 16, wherein said boron-fluoride compound comprises boron difluoride.

19. The PFET of claim 16, wherein said poly further includes an N type dopant.

20. The PFET of claim 17, wherein said dose of said implant of molybdenum in said poly gate is between approximately $3.0 \times 10^{12}$ atoms/cm$^2$ and approximately $1.0 \times 10^{13}$ atoms/cm$^2$.

* * * * *